United States Patent [19]

Köhl

[11] 4,109,128
[45] Aug. 22, 1978

[54] METHOD FOR THE PRODUCTION OF SEMICONDUCTOR RODS OF LARGE DIAMETER AND DEVICE FOR MAKING THE SAME

[75] Inventor: Franz Köhl, Burghausen, Fed. Rep. of Germany

[73] Assignee: Wacker-Chemitronik Gesellschaft für Elektronik-Grundstoffe mbH, Burghausen, Fed. Rep. of Germany

[21] Appl. No.: 715,073

[22] Filed: Aug. 17, 1976

[30] Foreign Application Priority Data

Sep. 1, 1975 [DE] Fed. Rep. of Germany ....... 2538854

[51] Int. Cl.² .......................... H05B 5/18; B01D 9/00
[52] U.S. Cl. .............................. 219/10.43; 23/273 SP; 156/605; 219/10.79
[58] Field of Search .............. 219/10.41, 10.43, 10.79, 219/10.57, 6.5; 13/DIG. 1; 23/273 SP, 273 SPC, 273 Z, 300, 301; 156/620, 615, 605

[56] References Cited

U.S. PATENT DOCUMENTS

| 1,981,632 | 11/1934 | Northrup | 219/10.79 |
| 2,408,229 | 9/1946 | Roberds | 219/10.79 |
| 3,271,115 | 9/1966 | Keller | 219/10.43 |
| 3,277,265 | 10/1966 | Reboux | 219/10.49 |
| 3,342,970 | 9/1967 | Emeis | 219/10.43 |
| 3,827,017 | 7/1974 | Keller | 219/10.43 |

FOREIGN PATENT DOCUMENTS

| 646,510 | 7/1964 | Belgium | 219/10.43 |
| 862,931 | 7/1949 | Fed. Rep. of Germany | 219/10.43 |
| 74,830 | 2/1917 | Switzerland | 219/6.5 |

Primary Examiner—Bruce A. Reynolds
Attorney, Agent, or Firm—Allison C. Collard

[57] ABSTRACT

Method for the production of dislocation-free, monocrystalline semiconductor rods with large diameters by crucible-free zone melting, which comprises producing the melting zone in a uniform electromagnetic field substantially symmetrical to the rod axis. The invention also relates to an induction heating coil for carrying out the method.

3 Claims, 3 Drawing Figures

METHOD FOR THE PRODUCTION OF SEMICONDUCTOR RODS OF LARGE DIAMETER AND DEVICE FOR MAKING THE SAME

The invention relates to a method for the production of dislocation-free, monocrystalline semiconductor rods with particularly large diameters, by crucible-free zone melting of a vertically oriented crystalline rod with a single-turn induction heating coil coaxially surrounding the rod, and an apparatus for carrying out the method.

In crucible free zone melting, apart from cylindrical coils and multi-turn coils as induction heating coils, preference is given today to the use of single-turn flat coils which permit the rod to be melted only at a very narrow point. The increased stability of the melting zone thus resulting is particularly important with rods of large diameter. With single-turn flat coils of this kind, rods have successfully been transformed into dislocation-free monocrystal with a diameter of up to 7.5 cm. However, the slit formed at the current supply lines of single-turn flat coils of this kind has an unfavorable effect in the case of relatively large rod diameters and may lead to refusion at the periphery of these rods near to the solidification front, causing dislocations.

The object of the present invention is, therefore, to find a zone drawing method which allows semiconductor rods, and particularly rods with large diameters, to be produced without dislocations.

This object is accomplished by crucible-free zone melting of a vertically oriented crystalline rod with a single-turn induction heating coil coaxially surrounding the rod, characterized by producing the melting zone in a uniform, electromagnetic field substantially symmetrical to the rod axis.

To carry out the method, single-turn induction heating coils are used which have one or more recesses corresponding to the free space formed between the ends of the coil as they merge into the current supply lines, the recesses being arranged in a circle about the axis of the rotation through the center of the coil, wherein the distance between the free space formed between the ends of the coil as they pass into the current supply lines and the following recess is equal to the distance between each two recesses.

The induction heating coils according to the invention may be designed as single-turn flat coils or as single-turn toroidal coils with, for example, substantially rectangular or oval, or preferably substantially square or round hollow cross-section. The hollow cross-section of the flat coils, through which is suitable cooling medium is flowing, may, for example, be substantially rectangular, approximately triangular or cone-shaped, wherein the acute angle or aperture angle is to lie at the inner edge of the coil.

The internal diameter of the induction heating coil according to the invention made, e.g., of silver, is about 20 to 40 mm, preferably 25 to 35 mm., the external diameter about 110 to 180 mm, preferably 130 to 150 mm; internal diameter means, in the case of the toroidal coils, with, for example, square or round hollow cross-section, double the distance from the point of the coil nearest the center to the center of the coil, and external diameter means double the distance from the point of the coil furthest away from the center of the coil to the center of the coil.

Because of the shape of the coil according to the invention, the asymmetry of the electromagnetic field caused by the slit-shaped free space formed between the ends of the coil as they pass into the current supply lines is compensated by the formation of several asymmetries which are produced by the invention recesses of the coil around the axis of rotation and which are of approximately the same order to magnitude, and a uniform electromagnetic field substantially symmetrical about the axis of the rod is formed. The symmetrical and uniform distribution of the field makes it possible to avoid re-fusions of the rod, as they occur at the periphery of the solidification front when using conventional single-turn flat coils owing to the thermal asymetry, i.e., the partial overheating at the narrow current supply lines.

Owing to the symmetrical and uniform field distribution of the induction heating coils according to the invention, the radial resistance gradients can be successfully and decisively improved, macroscopically and microscopically. The macroscopic improvement means that the resistance pattern, determined substantially by the concentration of dopant, becomes substantially uniform over the diameter of the rod, that is to say, does not drop towards the middle of the rod, or only to a negligible extent; the microscopic improvement means that the fluctuation in the resistance caused by striations is considerably reduced.

According to the inventive method using the novel induction heating coils, completely dislocation-free semiconductor crystals may be produced, and in addition, the outer rod shape of monocrystals of this kind becomes considerably smoother owing to the uniform thermal gradients and therewith lower latent inner tensions, whereby losses through grinding may be considerably reduced. Whereas, when using conventional single-turn flat coils, owing to the asymmetrical field they produce, in which the resultant of the electromagnetic field force pulls out of the axis of the rod, bending moments are transferred to the seedling which in the case of longer rods, may lead to breaking or overturning of the rod, according to the method of the invention, long and heavy rods with large rod diameters can be drawn perfectly.

Figure 1:
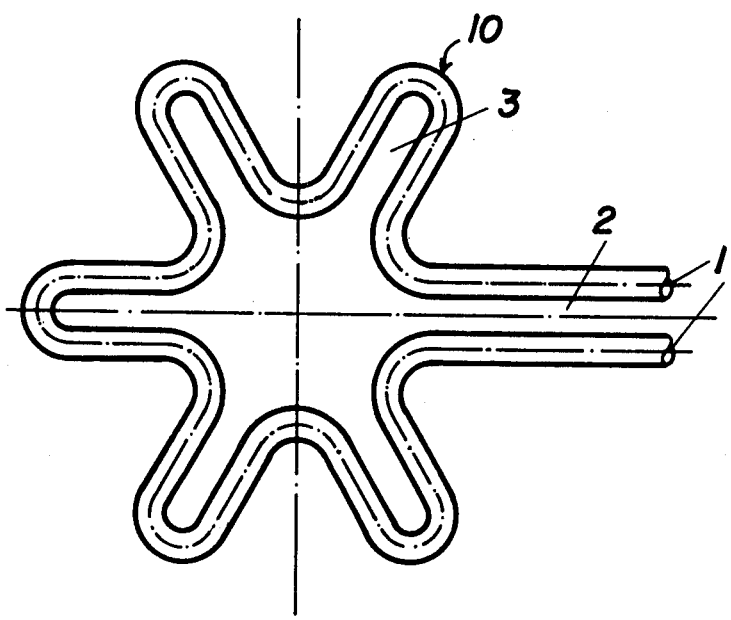
FIG. 1 is a plan view of an induction heating coil according to the invention, hexagon-shaped, and provided with five recesses.
Figure 2:
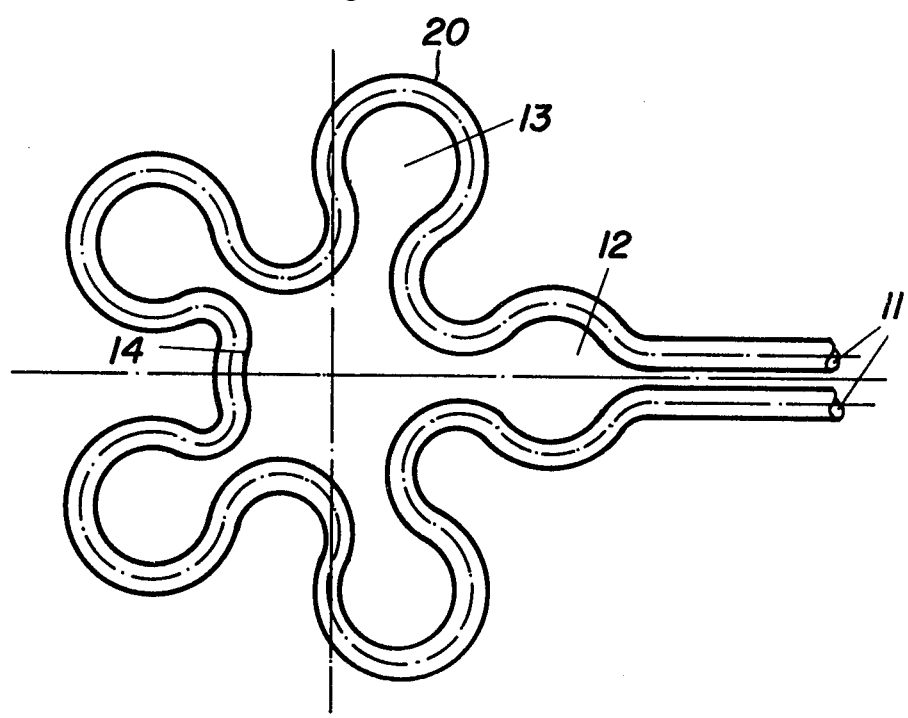
FIG. 2 is a plan view of another embodiment of a heating coil having a multiplicity of circular recesses.
Figure 3:
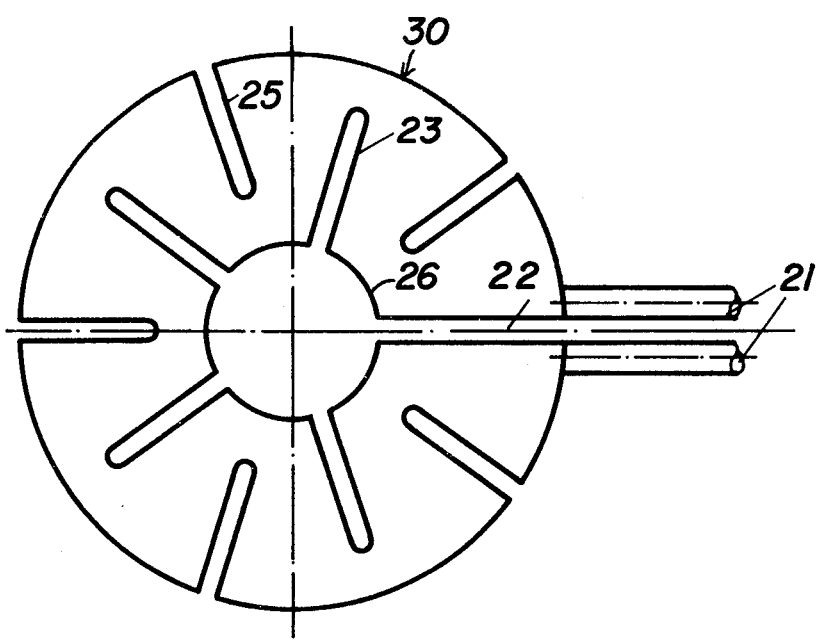
FIG. 3 is a plan view of another embodiment having sets of inwardly and outwardly extending slits.

In the accompanying drawings, three embodiments of the induction heating coils of the invention are shown in FIGS. 1-3, with reference to which the invention will be described in more detail without being limited thereto.

Referring now to FIG. 1, a single-turn induction heating coil 10 is shown having a round, hollow cross-section which in its shape follows the outlines of an equilateral hexagon and in continuation of the connecting lines between the center and angles of the hexagon is spread apart and outwards to form recesses 3 corresponding to the slit 2 formed between the current supply lines 1. According to the invention, induction heating coils can be produced with rectangular, oval, or preferably, square, hollow cross-section which follow the outlines of a polygon, preferably a four-to eight-sided figure, and are drawn outwards and apart in a corresponding manner in the continuation of the connecting lines between the center and angles of the polygon in each case to form recesses corresponding to the slit formed between the current supply lines.

FIG. 2 shows an induction heating coil 20 according to the invention in which the coil encircles the center point of the coil in four, approximately circular, similar loops which follow one after the other, and passes into the current supply lines 11 at a curve remote from the center. The free space 12 formed as the ends of the coil passing into the current supply lines 11 corresponds in its geometric dimensions again substantially to a recess limited by one of the coil loops. In a similar manner, coils with more or fewer such loops, preferably three to seven, which are approximately circular or, for example, oval or angular, may be produced wherein the free space formed between the ends of the coil as they pass into the current supply lines shall then be shaped according to the shape of the loop. According to a further embodiment, the coil is constructed so that opposite the current supply lines and near the center it has a curve 14, which is bent to be concave over a short distance. This embodiment facilitates the zone melting with seed crystals.

This point of the coil can be brought close up to the seed crystal, as a result of which less electrical power is necessary for the melting. After fusion onto the polyrod, the rod may then be brought easily back into the center of the coil. If, on the other hand, the seed crystal is fused on in the center of the coil, then, because of the poor coupling occasioned by the large distance, a great deal of electrical power is required, as a result of which the melting of the polyrod arranged above may be too strong and the seed crystal may ultimately drop off.

In FIG. 3, a further preferred embodiment of the induction heating coil according to the invention is shown. This single-turn flat coil 30 has four slits 23 which extend at right angles from the inner edge 26 outwards towards the periphery and correspond to the slit 22 between the ends of the coil as they pass into current supply lines 21. The distance between the slit 22 and the following slit 23 is equal to the distance between each two slits. Midway between each two slits 23 and midway between slit 22 and the nearest slit 23, there is in each case a further similarly dimensioned slit 25 extending at right angles from the periphery of the coil towards the inner edge of the flat coil.

In general, single-turn flat coils of this kind according to the invention may be provided with more or fewer, preferably about two to eight slits extending at right angles from the inner edge outwards to the periphery of the flat coil and substantially corresponding to the slit between the ends of the coil as they pass into the current supply lines, these slits corresponding in length to preferably 70 to 80% of the width of the coil.

According to a preferred embodiment of a single-turn flat coil of this kind, as illustrated in FIG. 3, the inner edge at the point opposite the slit 22 formed between the ends of the coil as they pass into current supply lines 11, is kept segment-shaped, there being merely formed at this point a slit-shaped recess extending at right angles from the periphery of the coil towards the inner edge of the coil. Such an induction heating coil is preferably used for crystal drawing with a seed crystal, wherein when placing the seed crystal on the polyrod, the seed crystal is then brought out of the middle of the coil near to this point. After placing (the crystal) the rod is normally returned again to the center of the coil or the coil returned to the middle of the rod to form the cone-shaped transition piece.

The method according to the invention may be used for the production of dislocation-free semiconductor rods, e.g., made of silicon, germanium or III/V compounds, such as, for example, gallium arsenide or gallium phosphide. It is possible to use the induction heating coils according to the invention in all customary zone-melting processes in principle, both under a protective gas and in vacuo, thus, for example, also in thin-neck pulling, in which a constricted point is formed between seed crystal and polyrod, or for example, also in wobbling, i.e., in zone melting of a crystalline rod with eccentric and concentric rotation of the monorod, or, for example, also in zone melting of a crystalline rod with lateral displacement of the part of the rod which is resolidifying.

What is claimed is:

1. An induction heating coil for the production of dislocation-free monocrystalline semiconductor rods of large diameters, said coil being a single turn coil the ends of which merge into the current supply lines, said coil encircling its center point in three to seven, approximately circular, similar loops, which follow one after another, and merging into the current supply lines at a curve remote from the center, said loops each defining a recess corresponding to the free space formed between the ends of the coil as they merge into the current supply lines, the recesses being arranged in a circle about the axis of rotation passing through the center of the coil, wherein the distance between said free space and the neighboring recesses is equal to the distance between two adjacent recesses.

2. An induction heating coil for the production of dislocation-free, monocrystalline semiconductor rods of large diameter, said coil being a flat single-turn coil which has two to eight slits which extend at right angles from the inner edge outwards to the periphery and correspond to the free space between the ends of the coil as they merge into the current supply lines, which slits correspond to 70 to 90% of the width of the coil, wherein the distance between the free space formed between the ends of the coil as they merge into the current supply lines and the following slit is equal to the distance between each two slits, and that midway between two such slits extending from the inner edge of the coil and midway between the free space and a neighboring slit there is formed in each case a substantially similarly dimensioned slit extending at right engles from the periphery of the coil towards the inner edge of the flat coil.

3. The induction heating coil according to claim 2, wherein opposite the free space formed between the ends of the coil as they merge into the current supply lines the inner edge of the coil is kept segment-shaped and there merely extends from the periphery of the coil at this point a slit-shaped recess at right angles towards the inner edge of the coil.

* * * * *

UNITED STATES PATENT OFFICE
CERTIFICATE OF CORRECTION

Patent No. 4,109,128                     Dated  AUG. 22, 1978

Inventor(s)  FRANZ KÖHL

It is certified that error appears in the above-identified patent and that said Letters Patent are hereby corrected as shown below:

Column 1, line 13, after "multi-turn" insert --flat--; Col. 1, line 41, delete "the" (first occurrence); Col. 1, line 51, delete "is" and substitute therefor --a--. Column 4, lines 53-54, delete "engles" and substitute therefor --angles--.

Signed and Sealed this

Seventeenth Day of April 1979

[SEAL]

Attest:

RUTH C. MASON
Attesting Officer

DONALD W. BANNER
Commissioner of Patents and Trademarks